United States Patent
Lee et al.

(10) Patent No.: US 7,846,765 B2
(45) Date of Patent: Dec. 7, 2010

(54) METHOD FOR FORMING ORGANIC LAYER PATTERN, ORGANIC LAYER PATTERN PREPARED BY THE SAME AND ORGANIC MEMORY DEVICES COMPRISING THE PATTERN

(75) Inventors: Sang Kyun Lee, Yongin-si (KR); Won Jae Joo, Yongin-si (KR); Kwang Hee Lee, Yongin-si (KR); Tae Lim Choi, Yongin-si (KR); Myung Sup Jung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 706 days.

(21) Appl. No.: 11/715,956

(22) Filed: Mar. 9, 2007

(65) Prior Publication Data

US 2008/0094872 A1 Apr. 24, 2008

(30) Foreign Application Priority Data

Oct. 24, 2006 (KR) ........................ 10-2006-0103429

(51) Int. Cl.
*H01L 51/40* (2006.01)

(52) U.S. Cl. ......................................... 438/99; 528/310

(58) Field of Classification Search ................... 438/99; 528/310

See application file for complete search history.

(56) References Cited

U.S. PATENT DOCUMENTS

| 5,286,841 | A  | * | 2/1994  | Auman et al. ................ 528/353 |
| 6,908,957 | B2 | * | 6/2005  | Musa et al. .................. 524/210 |
| 2004/0225026 | A1 | * | 11/2004 | Mizori et al. ................. 522/99 |
| 2005/0153238 | A1 | * | 7/2005  | Honda et al. ............. 430/270.1 |

* cited by examiner

*Primary Examiner*—W. David Coleman
*Assistant Examiner*—Sun M Kim
(74) *Attorney, Agent, or Firm*—Harness, Dickey & Pierce, P.L.C.

(57) ABSTRACT

Disclosed are a method for forming an organic layer pattern which is characterized by forming a thin layer by coating a coating solution including a polyimide-based polymer having a heteroaromatic pendant group including a heteroatom in its polyimide major chain, a photoinitiator and a crosslinking agent on a substrate and drying the substrate, and exposing and developing the thin layer, an organic layer pattern prepared by the method, and an organic memory device comprising the pattern. According to example embodiments, a high-resolution micropattern may be formed without undergoing any expensive process, e.g., photoresist, leading to simplification of the preparation process and cost reduction.

13 Claims, 4 Drawing Sheets

METHOD FOR FORMING ORGANIC LAYER PATTERN, ORGANIC LAYER PATTERN PREPARED BY THE SAME AND ORGANIC MEMORY DEVICES COMPRISING THE PATTERN

PRIORITY STATEMENT

This non-provisional application claims priority under 35 U.S.C. §119 to Korean Patent Application No. 10-2006-0103429, filed on Oct. 24, 2006, in the Korean Intellectual Property Office (KIPO), the entire contents of which are herein incorporated by reference.

BACKGROUND

1. Field

Example embodiments relate to a method for forming an organic layer pattern, an organic layer pattern, and an organic memory device comprising the pattern. Other example embodiments relate to a method for forming an organic layer pattern which is characterized by forming a thin layer by coating a coating solution including a polyimide-based polymer having a heteroaromatic pendant group including a heteroatom in its polyimide major chain, a photoinitiator and a crosslinking agent on a substrate and drying the substrate, and exposing and developing the thin layer, an organic layer pattern, and an organic memory device comprising the pattern.

2. Description of the Related Art

With the advancement of information and communication industry in recent years, the demand for various types of memory devices is increasing. Especially, memory devices for mobile terminals, smart cards, electronic cash, digital cameras, game machines and/or MP3 players may be nonvolatile implying that the information written therein is not deleted although the power is turned off. Most of such non-volatile memories may be silicon-based flash memories.

The existing flash memories may be confronted by several limitations, e.g., the frequency of writing/erasing is restricted, the writing speed is relatively slow, the production cost of a memory chip is increased due to a refinement procedure for achieving increased integrated memory capacity, and it may be impossible to further miniaturize the memory chip because of technical limitations.

As such technical limitations on the existing flash memories have been revealed, extensive research on the development of a next generation non-volatile memory device with increased speed, increased capacity, decreased power dissipation and decreased price is actively underway to overcome the above-mentioned technical limitations.

There are, as the next generation memories, a ferroelectric RAM, a magnetic RAM, a phase change RAM, a nanotube memory, a holographic memory and/or an organic memory depending on the material of a cell that is a fundamental unit inside a semiconductor.

Among them, the organic memory may achieve the memory characteristics by introducing an organic substance between a primary electrode and a secondary electrode, applying voltage thereto and employing bistability of a resistance value corresponding to the voltage. The organic memory may be a memory made in a manner that the resistance of the organic substance between the primary and the secondary electrodes may be reversibly varied by an electrical signal to write and read data '0' and '1'. Such organic memory has drawn attention as a next generation memory because it may improve processability, cost production and integration degree that are the disadvantages of existing flash memories while maintaining non-volatile characteristics.

FIG. 1 is a perspective view schematically illustrating one embodiment of a memory matrix using a conventional organic memory device. As illustrated in FIG. 1, the memory matrix may be fabricated on a proper substrate, e.g., glass and/or silicon. This memory matrix may include a primary electrode 10 and a secondary electrode 30, and an organic active layer 20 between. In such a structure, the cell formed at a cross point of the primary electrode 10 and the secondary electrode 30 may provide bistability characteristics. For the fabrication of such a memory cell array, there may be a need for patterning the organic active layer as well as the electrodes. As the organic memory device becomes miniaturized and highly integrated, patterning the organic active layer into a desired shape and size may become more important.

In a conventional method for patterning an organic active layer of an organic memory device, where the organic active layer is a single molecule, a shadow mask may be embodied by heat deposition or e-beam deposition, while where it is a polymer, the pattern may be formed by an etching step using a separate photoresist. For example, the latter method may be carried out by coating a conductive material on the whole surface of a glass substrate to form a lower electrode, coating a photoresist composition including an organic active layer material thereon, and selectively etching and patterning the organic active layer by using a photoresist mask. However, this photoresist method is disadvantageous because the process is complicated and the cost is increased by use of relatively expensive equipment.

As other methods for patterning an organic layer, there may be a soft lithography method and an ink jet method. In these methods, the soft lithography method may form a pattern by dissolving a watersoluble photosensitive resin composition in water, coating it on the surface of a glass substrate and drying the substrate, exposing the photoresist layer thus obtained through a shadow mask and developing the layer, forming a photocurable pattern on the glass substrate by removing an unexposed area, coating a photo-absorptive material on the whole surface thereof and drying the same, and peeling-removing the photocurable pattern and the photo-absorptive material thereon. However, because this soft lithography method employs a mechanism of curing an active layer with heat or light, there may be a limitation on the selection of raw materials.

Meanwhile, the ink jet method has several disadvantages because it cannot technically apply for the formation of a submicron pattern due to nozzle blockade and it may be difficult to select a suitable solvent and maintain a constant concentration.

SUMMARY

Therefore, example embodiments have been made in view of the above problems of the related art, and example embodiments provide a method for forming an organic layer pattern which makes it possible to form a fine organic active layer pattern, without undergoing a complicated process, e.g., photoresist. Example embodiments provide an organic active layer and an organic memory device comprising the same.

In accordance with example embodiments, a method for forming an organic layer pattern may include forming a thin layer by coating a coating solution including a polyimide-based polymer having a heteroaromatic pendant group including a heteroatom in its polyimide major chain, a photoinitiator and a crosslinking agent on a substrate, and drying the substrate, and exposing the formed thin layer through a photomask having a desired pattern, and removing an unexposed area of the thin layer by developing the exposed thin layer, to thereby form a negative pattern thereon.

The polyimide-based polymer may be a polymer represented by the following Formula 1:

[Formula 1]

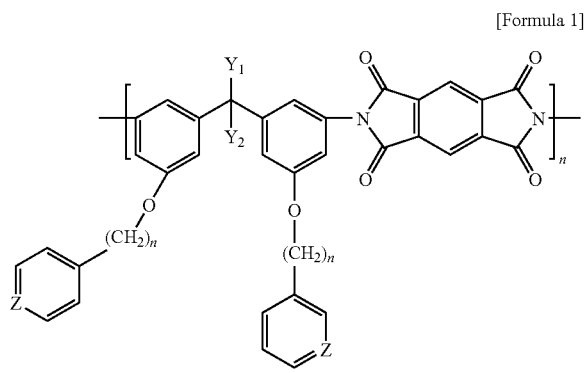

wherein $Y_1$ and $Y_2$ are independently $C_{1-12}$ alkyl or $CX_3$, X being F, Cl, Br or I; Z is N, O or S; m is in the range of about 10 to about 100; and n is in the range of about 1 to about 12.

The polymer of Formula 1 may be a polymer represented by the following Formula 2:

[Formula 2]

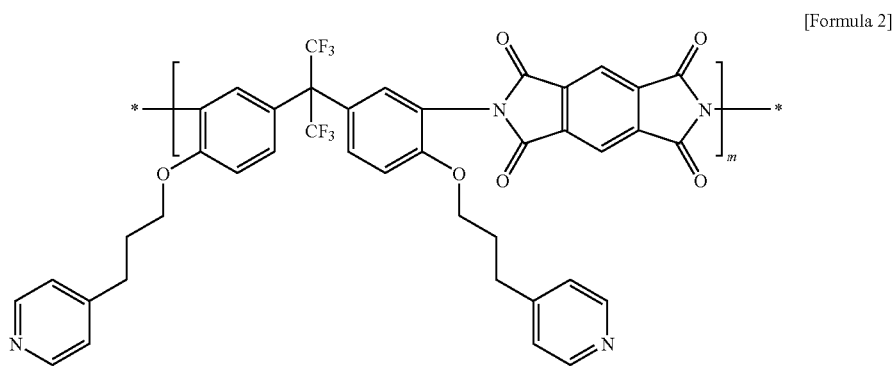

wherein m is in the range of about 10 to about 100.

In accordance with example embodiments, there is provided an organic layer pattern of example embodiments. In accordance with example embodiments, there is provided an organic memory device including the organic layer patterned between a primary electrode and a secondary electrode by the method of example embodiments.

BRIEF DESCRIPTION OF THE DRAWINGS

Example embodiments will be more clearly understood from the following detailed description taken in conjunction with the accompanying drawings.

FIG. 1 is a perspective view schematically illustrating a conventional memory cell array;

FIG. 2 is a schematic view showing the formation of a polyimide-based polymer of a chain-like crosslinking structure in example embodiments;

FIG. 3 is a cross-sectional view schematically illustrating an organic memory device according to example embodiments;

FIG. 4 is a flowchart for explaining a method for manufacturing an organic memory device according to example embodiments;

FIG. 5 is a photograph of an organic active layer pattern prepared according to example embodiments; and FIG. 6 is a graph showing current-voltage (I-V) characteristics of an organic memory device prepared according to example embodiments.

Figure 1:
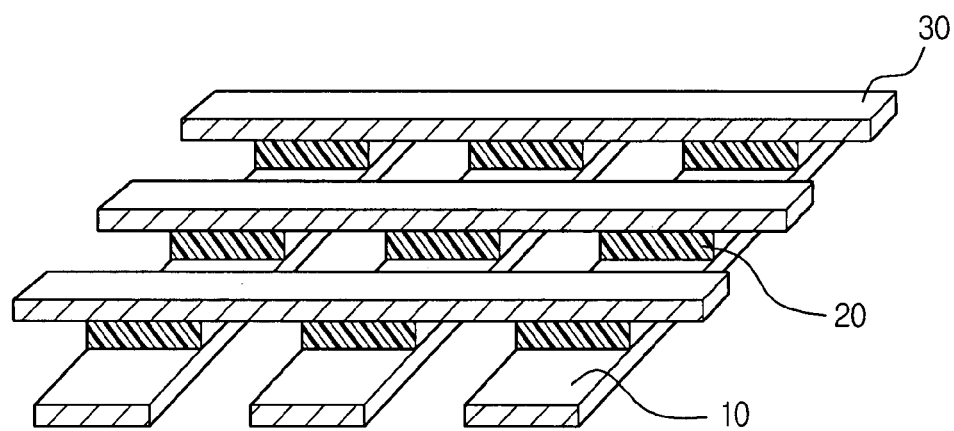
FIGS. 1-6 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be explained in more detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath, " "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to a method for forming an organic layer pattern. When forming an organic layer pattern according to the method of example embodiments, a thin layer may be formed by coating a coating solution including a polyimide-based polymer having a heteroaromatic pendant group including a heteroatom in its polyimide major chain, a photoinitiator and a crosslinking agent, on a substrate and drying the substrate. Subsequently, the thin layer thus formed may be exposed through a photomask having a desired pattern followed by developing the exposed thin layer to remove an unexposed area, thereby forming a negative pattern on the thin layer. According to the method of example embodiments, a fine organic layer pattern may more easily be fabricated, without undergoing a complicated process, e.g., photoresist.

Figure 2:
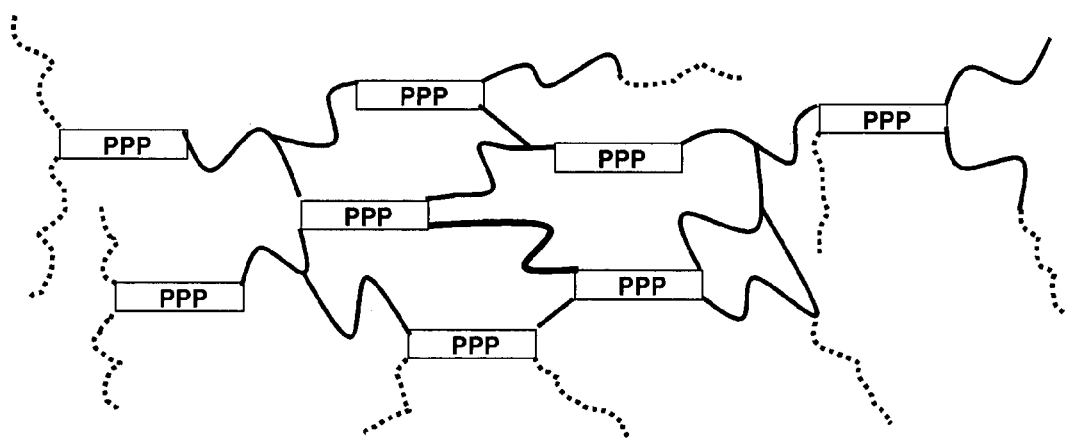

Raw materials of an organic layer used in example embodiments may include a polyimide-based polymer having a heteroaromatic pendant group including a heteroatom in its polyimide major chain. FIG. 2 is a schematic view showing the formation of a chain-like crosslinking structure of a polyimide-based polymer (polyimide pyrridine propanol of Formula 2, PPP) in example embodiments. The polyimide-based polymer showing increased thermotolerance may be subjected to radical polymerization between a double bond (vinyl) of maleic acid anhydride and a vinyl group of a crosslinking agent by means of a photoinitiator under the condition that it may be mixed with the photoinitiator and crosslinking agent upon receiving light, thereby forming the chain-like crosslinking structure as illustrated in FIG. 2.

One example of the polyimide-based polymer according to example embodiments may be a polymer represented by the following Formula 1:

[Formula 1]

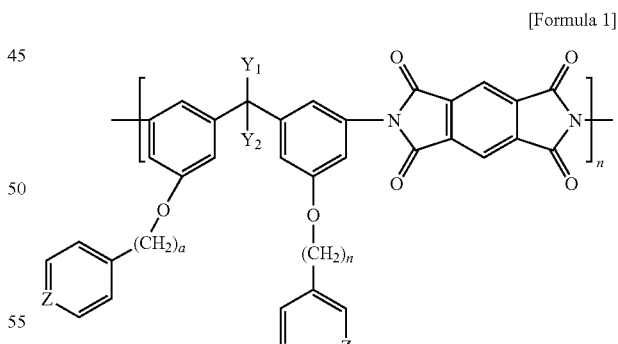

wherein $Y_1$ and $Y_2$ are independently $C_{1-12}$ alkyl or $CX_3$, X being F, Cl, Br or I; Z is N, O or S; m is in the range of about 10 to about 100; and n is in the range of about 1 to about 12.

An example of the polymer of Formula 1 may be a polymer represented by the following Formula 2:

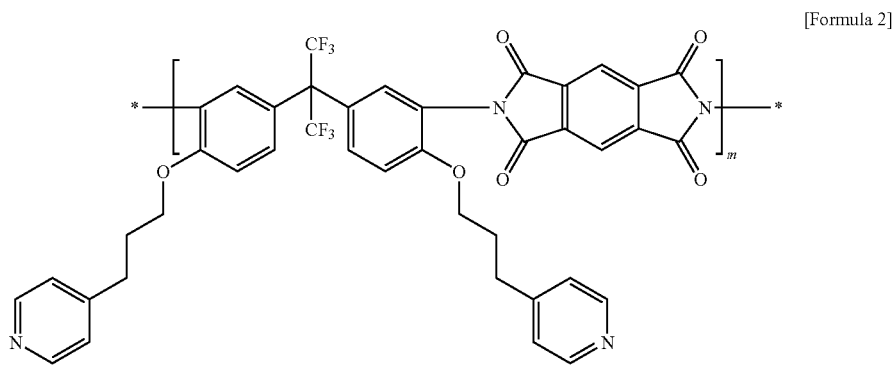

[Formula 2]

wherein m is in the range of about 10 to about 100.

Electrical conductivity of the polyimide-based polymer may be about $10^{-12}$ S/cm or below.

Meanwhile, the photoinitiator used in example embodiments may function to induce crosslinking formation by generating radicals through the absorption of ultraviolet rays, and examples of the photoinitiator employable in example embodiments may include acetophenon-based, benzoin-based, benzophenon-based, and thioxanthone-based photoinitiators, but may not be necessarily limited thereto.

The acetophenon-based photoinitiators may include 4-phenoxy dichloroacetophenone, 4-t-butyl dichloroacetophenone, 4-t-butyl trichloroacetophenone, diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone and/or 2-methyl-1-[4-(methylthio)phenyl]-2-morpholino-propane-1], but may not be necessarily limited thereto.

The benzoin-based photoinitiators may include benzoin, benzoin methyl ether, benzoin ethyl ether, benzoin isopropyl ether, benzoin isobutyl ether and/or benzyl dimethyl ketal, but may not be limited thereto. The benzophenon-based photoinitiators may include benzophenone, benzoyl benzoic acid, benzoyl benzoic acid methyl ester, 4-phenyl benzophenone, hydroxy benzophenone, 4-benzoyl-4'-methyl diphenyl sulphide and/or 3,3'-dimethyl-4-methoxy benzophenone, but may not be limited thereto.

The thioxanthone-based photoinitiators may include thioxanthone, 2-chlorothioxanthone, 2-methylthioxanthone, 2,4-dimethylthioxanthone, 2-isopropylthioxanthone, 2,4-dichlorothioxanthone, 2,4-diethylthioxanthone and/or 2,4-diisopropylthioxanthone), but may not be limited thereto. For example, Irgacure 184 manufactured by Ciba-Geigy Co. Ltd. may be used.

Besides the photoinitiators as described above, example embodiments may use 1-phenyl-1,2-propandione-2-(O-ethoxycarbonyl)oxime 2,4,6-trimethyl benzoyl diphenyl phosphine oxide, methyl phenylglyoxylate, benzyl, 9,10-phenaphthalene quinone, camphorquinone, dibenzosuberone, 2-ethylanthraquinone, 4,4'-diethylisophthalophenone and/or 3,3',4,4'-tetra(t-butylperoxycarbonyl)benzophenone.

The crosslinking agent used in example embodiments may be selected from the group consisting of allyl compounds, e.g., divinylbenzene, 1,4-divinyloxybutane, divinylsulfone, diallyl phthalate, diallylacrylamide, triallyl(iso)cyanurate and trially trimelitate; and (poly)alkylene glycol di(meta) acrylate compounds, e.g., hexanedioldiacrylate, (poly)ethylene glycol di(meta)acrylate, (poly)propylene glycol di(meta)acrylate, pentaerythritol tetra(meta)acrylate, pentaerythritol tri(meta)acrylate, pentaerythritol di(deta)acrylate, trimethylolpropane tri(meta)acrylate, dipentaerythritol hexa(meta) acrylate, dipentaerythritol penta(meta)acrylate and/or glycerol tri(meta)acrylate, but may not be necessarily limited thereto.

According to example embodiments, an organic layer pattern may be formed by coating a coating solution including a polyimide-based polymer, a photoinitiator and a crosslinking agent on a substrate, and exposing and developing the substrate. As described above, the coating solution may be prepared by dissolving the polyimide-based polymer, one or more photoinitiators, and the crosslinking agent in an organic solvent, and then the substrate may be uniformly coated with the coating solution. The organic solvent used in the preparation of the coating solution may not be particularly limited. In terms of miscibility and thin layer formation, the solvent may be selected from the group consisting of N-methylpyrrolidone(NMP), DMF, 4 hydroxy-4-methyl-2-pentanone, ethylene glycol monoethyl ether and 2-methoxyethanol, and used alone or in the form of a mixture thereof.

There may be no particular limitation on the composition of the coating solution used in example embodiments, and, for example, the coating solution may include about 0.5 g of a polymer molecule, about 0.0025 g of a photoinitiator, about 0.05 g of a crosslinking agent and about 4 g of NMP solvent.

The method of coating a coating solution on a substrate may be performed by spin coating, dip coating, spray coating, flow coating, screen printing, electrostatic coating, blade coating, roll coating and/or ink jet coating, which is well-known in the art, but may not be limited thereto, for example, spin coating. Where the spin coating method is performed, the spinning speed may be set within the range of about 500 rpm to about 2500 rpm, but the exact spinning speed may be determined depending on viscosity of a coating solution and coating thickness.

Further, it may also be possible to transfer onto another substrate after coating a coating solution on the substrate, e.g., a film, and there may be no particular limitation on the transfer or its application method. The thickness of a coated thin layer may not be particularly limited and may be in a general range depending on the use of an organic layer. After the substrate is completely coated with the coating solution, the substrate may be pre-baked at about 80° C. ~ about 120° C., for example, about 100° C. for about 1 minute to about 2 minutes to evaporate the solvent, thus forming a film thereon.

After the formation of the thin film, the substrate may be exposed by irradiating ultraviolet rays through a photomask having a desired pattern, and thus exposed thin film may be developed with a suitable developing solution, thereby obtaining a patterned organic layer. Such exposure may be conducted by irradiating a light having a wavelength in the range of about 150 nm to about 400 nm, and the exposure amount during the light irradiation may be in the range of about 100 to about 800 mJ/cm$^2$.

During the exposure, radicals generated by the photoinitiator may stimulate photopolymerization in the exposed area as described above, and therefore, when the terminal end of the polyimide-based polymer is end-capped with maleic acid anhydride, the double bond (vinyl) of the maleic acid anhydride and a vinyl group of the crosslinking agent may be subjected to crosslinking polymerization by means of the radicals generated by the photoinitiator. The chemical structure of the exposed area may become insoluble due to such crosslinking polymerization, and thus, may exhibit reduced dissolution rate by developing with a developing solution in the following step, as compared with the unexposed area. As a result, only the exposed area may be left on the substrate by such a difference in the dissolution rate, thereby forming a desired negative pattern.

The developing solution used in the example embodiments may not be particularly limited so long as it does not hamper the example embodiments, and any organic solvent conventionally used in the field of photolithography may be employed. In view of dispersion stability and coating uniformity, DMF, 4-hydroxy-4-methyl-2-pentanone, ethylene glycol monoethyl ether and/or 2-methoxyethanol may be employed.

Example embodiments are directed to an organic layer pattern of example embodiments. The patterned organic layer prepared according to the method of example embodiments may be applied to an organic EL device and a photoelectric transducer as well as used as an organic active layer for an organic memory device. Example embodiments relate to an organic memory device including the organic layer pattern prepared according to the method of example embodiments as described above. Such organic memory device may include the organic active layer between a primary electrode and a secondary electrode and may be fabricated appropriately by a conventional method known in the art.

Figure 3:
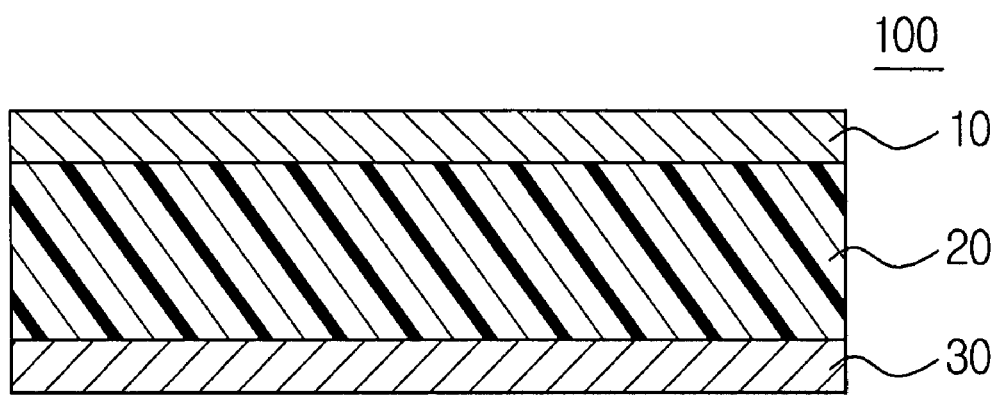

FIG. 3 is a cross-sectional view schematically illustrating an organic memory device according to example embodiments. Referring to FIG. 3, the organic memory device 100 of example embodiments may include an organic active layer 20 sandwiched between a primary electrode 10 and a secondary electrode 30. When a certain voltage is applied to the memory device 100, a resistance value of the organic active layer 20 may show a bistability state, which presents memory characteristics. Because such memory characteristics are represented due to the characteristics of an organic material used, the organic memory device of example embodiments may maintain its intrinsic non-volatile characteristics although the power is turned off.

The primary electrode 10 and the secondary electrode 30 may be formed of one or more electrical conductive materials selected from the group consisting of metals, metal alloy, metal nitrides, oxides, sulfides, carbon polymers, conductive polymers and/or organic conductors. Examples of the electrode material may include, but may not be necessarily limited to, aluminum(Al), gold(Au), silver(Ag), platinum(Pt), copper(Cu), titanium(Ti), tungsten(W) and/or indium oxide (ITO).

Examples of the conductive polymers employable as an electrode material may include polydiphenylacetylene, poly(t-butyl)diphenylacetylene, poly(trifluoromethyl)diphenylacetylene, poly(bistrifluoromethyl)acetylene, polybis(T-butyldiphenyl)acetylene, poly(trimethylsillyl)diphenylacetylene, poly(carbazole)diphenylacetylene, polydiacetylene, polyphenylacetylene, polypyrridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsillyl)phenylacetylene, and/or phenylpolyacetylene polymer and polythiophene which are derivatives thereof.

In order to prevent or retard the primary electrode or the secondary electrode from being damaged by the use of an organic substance, the organic memory device of example embodiments may further form a barrier layer above the primary electrode or below the secondary electrode. Such barrier layer may include a material selected from the group consisting of $SiO_x$, $AlO_x$, $NbO_x$, $TiO_x$, $CrO_x$, $VO_x$, $TaO_x$, $CuO_x$, $MgO_x$, $WO_x$ and/or $AlNO_x$, for example, $SiO_2$, $Al_2O_3$, $Cu_2O$, $TiO_2$ and/or $V_2O_3$. The barrier layer in example embodiments may also be formed by using an organic material, e.g., Alq3, polymethylmetacrylate, polystyrene and/or PET. The thickness of the barrier layer may be in the range of about 20 Å to about 300 Å.

Figure 4:
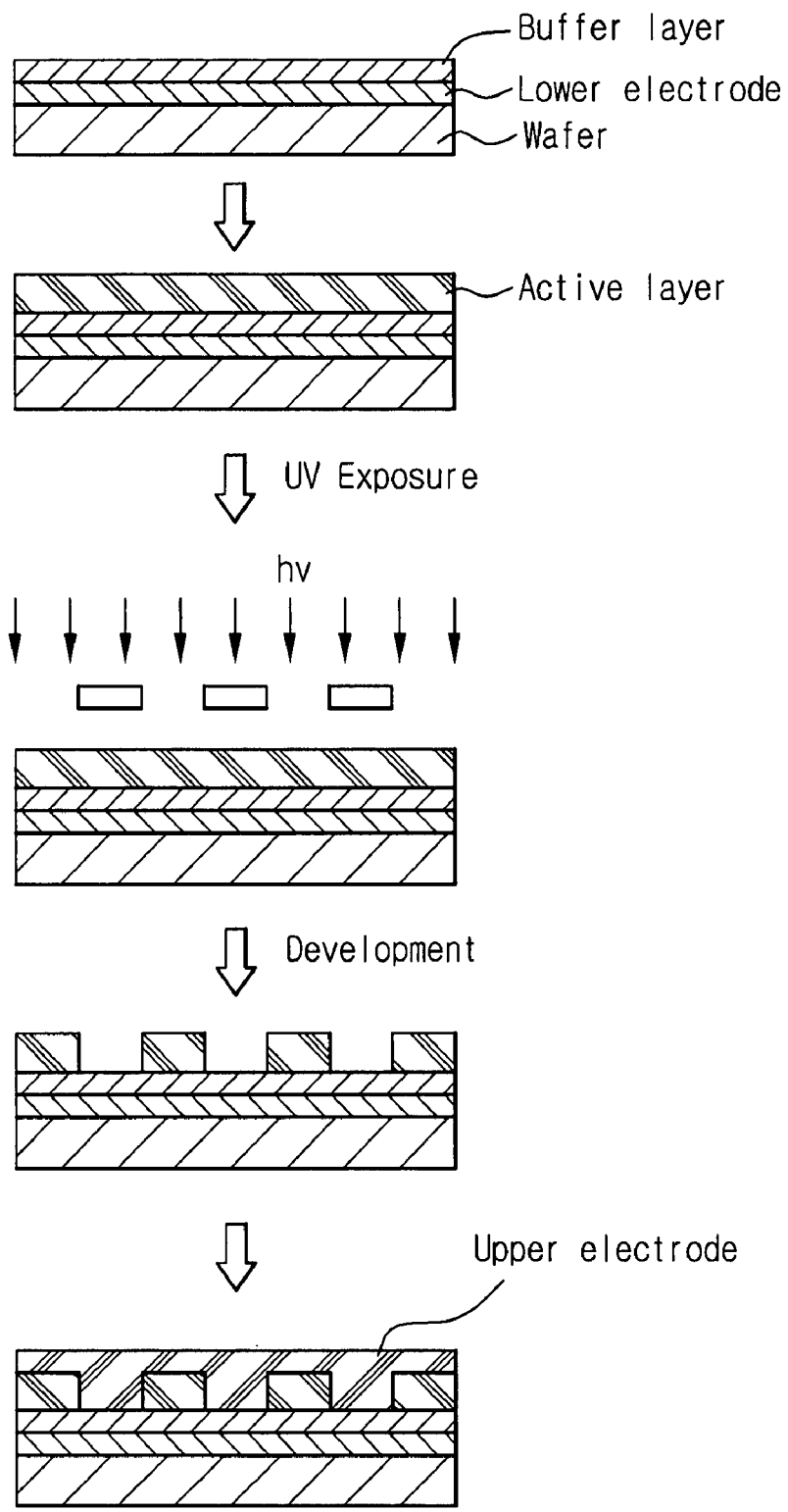

The organic memory device of example embodiments may be fabricated by a conventional method well-known in the art except the procedure of preparing an organic active layer. For instance, FIG. 4 illustrates a flowchart for explaining a method for fabricating an organic memory device according to example embodiments. Referring to FIG. 4, when forming an organic active layer, a primary electrode (lower electrode) and a buffer layer may be formed on a silicon wafer substrate in sequence.

Subsequently, the buffer layer may be coated with a coating solution including a polyimide-based polymer having a heteroaromatic pendant group including a heteroatom in its polyimide major chain, a photoinitiator and a crosslinking agent, and then dried, thereby forming an organic active layer thin film.

The coating method of the organic active layer may not be particularly limited, and may be performed by a general coating method well-known in the art, for example, spin coating, dip coating, spray coating, flow coating, screen printing, electrostatic coating, blade coating, roll coating and/or ink jet printing. The thickness of the organic active layer may be in the range of about 50 Å to about 3000 Å.

The solvent usable in the spin coating of the organic active layer may be selected from the group consisting of chloroform, N-methylpyrrolidone, actone, cyclopentanon, cyclohexaneon, methylethylketone, ethylcellosolveacetate, butylacetate, ethyleneglycol, toluene, xylene, tetrahydrofuran, dimethylformamide, chlorobenzene and acetonitrile, and used alone or in the form of a mixture thereof with a certain ratio.

The thin film so formed may be exposed by irradiating a light, e.g., ultraviolet rays, through a photomask having a desired pattern and developed to remove an unexposed area from the thin layer, thus forming a negative pattern. Once the organic thin layer is formed on the substrate in such a manner, the secondary electrode (upper electrode) may be fabricated thereon. The primary and the secondary electrodes may be fabricated by a general method, e.g., heat deposition, sputtering, e-beam evaporation and/or spin coating.

Now, example embodiments will be described in more detail with reference to the following examples. However, these examples are provided for the purpose of illustration and are not to be construed as limiting the scope of example embodiments.

EXAMPLES

Example 1

Formation of an Organic Layer Pattern

A coating solution was prepared by using a polyimide-based polymer of Formula 2 according to the following composition:

| | |
|---|---|
| Polymer of Formula 2 | about 5 g |
| Photoinitiator(Ciba-Geigy Co. Ltd., Irgacure 184) | about 0.05 g |
| Crosslinking agent(dipentaerytritol hexaacrylate) | about 0.5 g |
| NMP | about 1 g |

Figure 5:
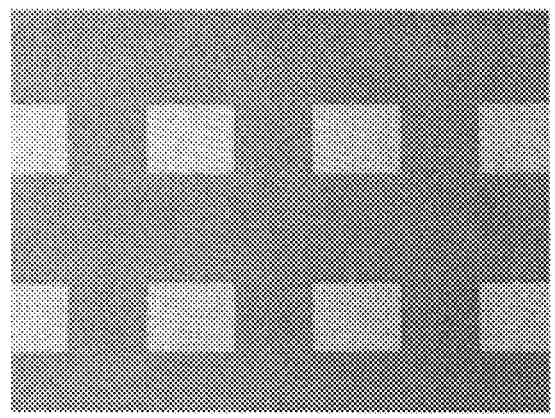

The coating solution was stirred for about 1 hour to fully mix the ingredients, filtered with a about 0.45 microsyringe, and then subjected to spin coating on a silicon wafer at a rate of about 500 rpm. Subsequently, it was dried at about 90° C. for about 1 minute to remove the solvent left on the coated surface. The coating film thus prepared was exposed by using an Hg arc lamp in the exposure amount of about 500 mJ/cm$^2$ for about 10 seconds through an about 100 µm shadow mask. Then, the exposed film was developed with an NMP developing solution for about 20 seconds, to thereby obtain a negative pattern of the organic layer. A photograph of the organic layer pattern thus obtained is depicted in FIG. 5.

Example 2

Fabrication of an Organic Memory Device

A patterned secondary electrode was deposited on a glass substrate, wherein aluminum is deposited in a thickness of about 80 nm according to thermal evaporation. A negative pattern of the organic layer was formed on the substrate having the secondary electrode formed thereon in the same manner as Example 1. Finally, a primary electrode was deposited by using copper (Cu) to a thickness of about 80 nm according to thermal evaporation, to thereby prepare an organic memory device. The thickness of the organic active layer was set to about 40 nm and measured by using an Alpha-Step™ profilometer. The thickness of the electrode deposited was controlled by a quartz crystal monitor.

Test Example

Test for Switching Characteristics of an Organic Memory Device

Figure 6:
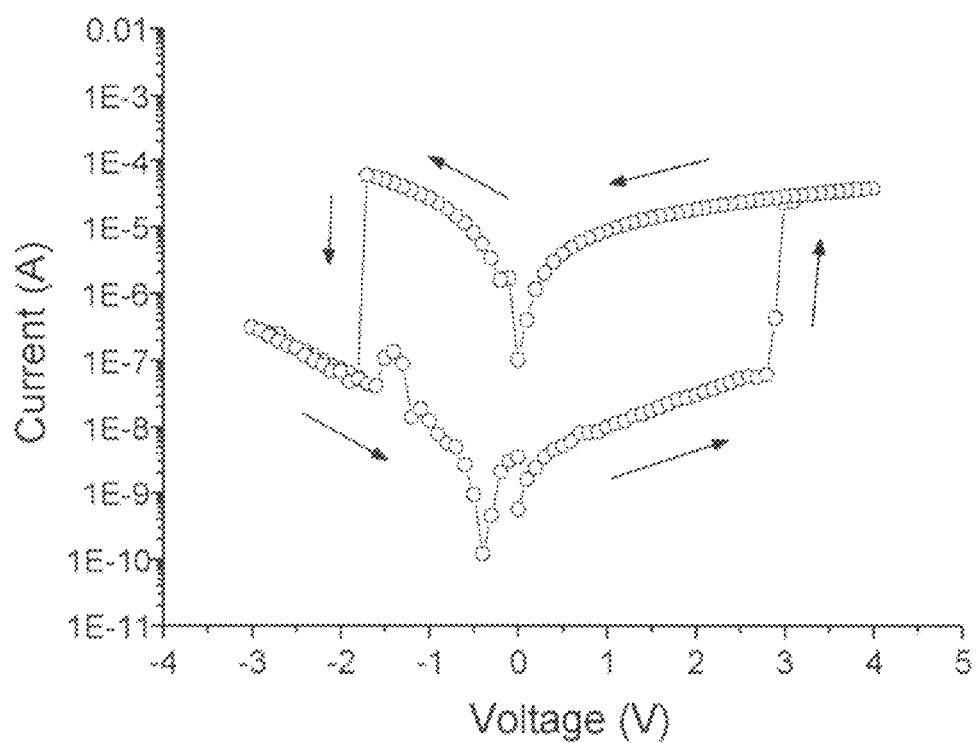

Switching characteristics of the organic memory device prepared in Example 1 were evaluated by applying voltage thereto and observing a change in current, and the results are shown in FIG. 6. As may be seen from FIG. 6, the organic memory device including the organic layer composed of the polyimide-based polymer according to example embodiments has characteristics in that the higher-resistance state and the lower-resistance state are switched depending on a voltage applied thereto. Further, the organic memory device of example embodiments, although voltage or current may not be applied thereto, may maintain these two different resistance states for a long time, respectively, and such resistance states may easily be read through the detection of current generated by applying a decreased voltage thereto. Therefore, it may be confirmed that the organic memory device of example embodiments may be used as the memory device.

From these results, the organic memory device of example embodiments may be fabricated by a simpler and inexpensive process, e.g., spin coating, and may exhibit improved switching characteristics.

As apparent from the foregoing, the method of example embodiments may form a fine organic layer pattern without performing a complicated process requiring expensive tools and materials, e.g., photoresist, thereby simplifying the preparation process and reducing the production cost. Further, the organic memory device prepared by the method of example embodiments may be advantageous in that it has improved processability and decreased production costs. The method for forming an organic layer pattern of example embodiments may be effectively applied to most kinds of electronic devices including an organic layer pattern, e.g., organic EL devices and/or solar cells, in addition to organic memory devices.

Although example embodiments have been disclosed for illustrative purpose, those skilled in the art will appreciate that various modifications, additions and substitutions are possible, without departing from the scope and spirit of the accompanying claims. For instance, the method for forming an organic layer pattern of example embodiments may be effectively applied to patterning an organic layer in an organic light emitting device and a photoelectric transducer as well as the patterning of an organic active layer in an organic memory device.

What is claimed is:

1. A method for forming an organic layer pattern, comprising:
   forming a thin layer by coating a coating solution including a polyimide-based polymer end-capped with maleic acid anhydride, having a heteroaromatic pendant group including a heteroatom in its polyimide major chain, a photoinitiator and a crosslinking agent on a substrate, and drying the substrate; andexposing the formed thin layer through a photomask having a desired pattern formed thereon, and
   removing an unexposed area of the thin layer by developing the exposed thin layer, to thereby form a negative pattern on the thin layer.

2. The method according to claim 1, wherein the polyimide-based polymer is a polymer represented by the following Formula 1:

[Formula 1]

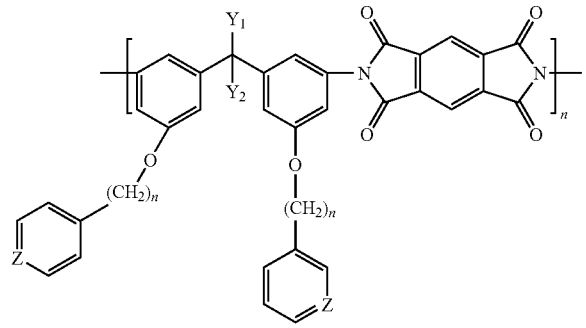

wherein $Y_1$ and $Y_2$ are independently $C_{1-12}$ alkyl or $CX_3$, X being F, Cl, Br or I; Z is N, O or S; m is in the range of about 10 to about 100; and n is in the range of about 1 to about 12.

3. The method according to claim 2, wherein the polymer of Formula 1 is a polymer represented by the following Formula 2:

[Formula 2]

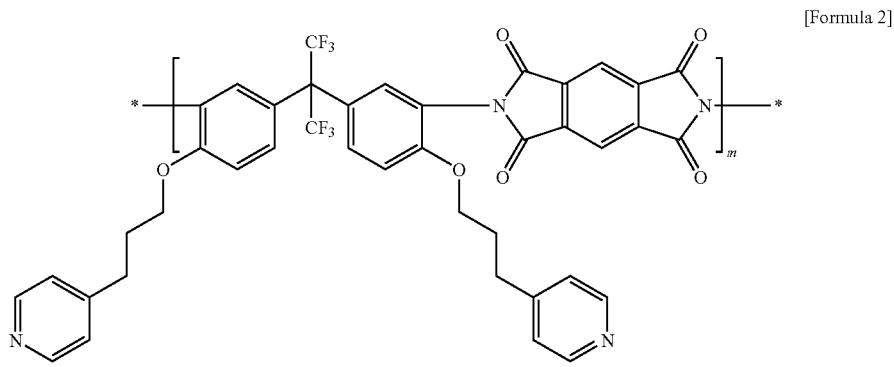

wherein m is in the range of about 10 to about 100.

4. The method according to claim 1, the polymer has an electrical conductivity of about $10^{-12}$ S/cm or below.

5. The method according to claim 1, wherein the photoinitiator is acetophenon-based, benzoin-based, benzophenon-based, thioxanthone-based or copolymer-based photoinitiators.

6. The method according to claim 5, wherein the photoinitiator is one or more selected from the group consisting of 1-phenyl-1,2-propandione-2-(O-ethoxycarbonyl)oxime, 2,4,6-trimethyl benzoyl diphenyl phosphine oxide, methyl phenylglyoxylate, benzyl, 9,10-phenaphthalene quinone, camphorquinone, dibenzosuberone, 2-ethylanthraquinone, 4,4'-diethylisophthalophenone, and 3,3',4,4'-tetra(t-butylperoxycarbonyl) benzophenone.

7. The method according to claim 1, wherein the crosslinking agent is one or more selected from the group consisting of allyly compounds including divinylbenzene, 1,4-divinyloxybutane, divinylsulfone, diallyl phthalate, diallylacrylamide, triallyl (iso)cyanurate and trially trimelitate; and (poly)alkylene glycol di(meta)acrylate compounds including hexanedioldiacrylate, (poly)ethylene glycol di(meta)acrylate, (poly)propylene glycol di(meta)acrylate, pentaerythritol tetra(meta)acrylate, pentaerythritol tri(meta)acrylate, pentaerythritol di(deta)acrylate, trimethylolpropane tri(meta)acrylate, dipentaerythritol hexa(meta)acrylate, dipentaerythritol penta(meta)acrylate, and glycerol tri(meta)acrylate.

8. The method according to claim 1, wherein forming the thin layer includes forming the thin layer by spin coating, dip coating, spray coating, flow coating, screen printing, electrostatic coating, blade coating, roll coating or inkjet printing.

9. The method according to claim 1, wherein exposing the formed thin layer includes exposing the formed thin layer by irradiating a light having about 150 nm to about 400 nm in wavelength.

10. An organic layer pattern prepared by the method according to claim 1.

11. An organic memory device comprising the organic layer pattern of claim 10 between a primary electrode and a secondary electrode.

12. The organic memory device according to claim 11, further comprising:
a barrier layer above the primary electrode or below the secondary electrode.

13. The organic memory device according to claim 12, wherein the barrier layer includes an inorganic material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$ or an organic material selected from the group consisting of Alq3, polymethylmetacrylate, polystyrene, and PET.

* * * * *